(12) United States Patent
Kato et al.

(10) Patent No.: US 7,931,206 B2
(45) Date of Patent: Apr. 26, 2011

(54) WIRELESS IC DEVICE

(75) Inventors: Noboru Kato, Moriyama (JP); Yuya Dokai, Nagaokakyo (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/469,896

(22) Filed: May 21, 2009

(65) Prior Publication Data

US 2009/0224061 A1 Sep. 10, 2009

Related U.S. Application Data

(63) Continuation of application No. PCT/JP2008/058168, filed on Apr. 28, 2008.

(30) Foreign Application Priority Data

May 10, 2007 (JP) ................................. 2007-126149

(51) Int. Cl.
*G06K 19/06* (2006.01)
(52) U.S. Cl. .......................... 235/492; 235/487; 257/689
(58) Field of Classification Search .................. 235/439, 235/441, 487, 492; 343/700 MS, 795; 257/689
See application file for complete search history.

(56) References Cited

U.S. PATENT DOCUMENTS

| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,107,920 A | 8/2000 | Eberhardt et al. |
| 6,172,608 B1 | 1/2001 | Cole |

(Continued)

FOREIGN PATENT DOCUMENTS

EP 0 694 874 A2 1/1996

(Continued)

OTHER PUBLICATIONS

Kato et al.: "Wireless IC Device and Manufacturing Method Thereof," U.S. Appl. No. 12/432,854, filed Apr. 30, 2009.

(Continued)

*Primary Examiner* — Steven S Paik
*Assistant Examiner* — William M Anderson, Jr.
(74) *Attorney, Agent, or Firm* — Keating & Bennett, LLP

(57) ABSTRACT

A wireless IC device includes a radiation plate, a feeding circuit substrate on which a feeding circuit including a resonant circuit including an inductance element is provided, the feeding circuit being electromagnetically coupled to the radiation plate, and a wireless IC chip including a connection electrode, the wireless IC chip being disposed on the feeding circuit substrate. A mounting electrode is provided on the feeding circuit substrate. The frequency of signals sent and received using the radiation plate substantially corresponds to the resonant frequency of the resonant circuit. The wireless IC chip is electromagnetically coupled to the mounting electrode.

13 Claims, 4 Drawing Sheets

U.S. PATENT DOCUMENTS

| | | |
|---|---|---|
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,329,915 B1 * | 12/2001 | Brady et al. ............... 340/572.1 |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 6,104,611 A1 | 8/2008 | Lastinger |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2003/0020661 A1 | 1/2003 | Sato |
| 2004/0001027 A1 | 1/2004 | Killen et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0164414 A1 | 7/2007 | Dokai et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0065594 A1 | 3/2009 | Kato et al. |

FOREIGN PATENT DOCUMENTS

| | | | |
|---|---|---|---|
| EP | 0 977 145 A2 | 2/2000 | |
| EP | 1 010 543 A1 | 6/2000 | |
| EP | 1 160 915 A2 | 12/2001 | |
| JP | 03-262313 A | 11/1991 | |
| JP | 04-150011 A | 5/1992 | |
| JP | 05-327331 A | 12/1993 | |
| JP | 6-53733 A | 2/1994 | |
| JP | 06-077729 A | 3/1994 | |
| JP | 06-177635 A | 6/1994 | |
| JP | 07-183836 A | 7/1995 | |
| JP | 08-056113 A | 2/1996 | |
| JP | 8087580 A | 4/1996 | |
| JP | 11-149537 A | 6/1996 | |
| JP | 08-176421 A | 7/1996 | |
| JP | 08-279027 A | 10/1996 | |
| JP | 08-307126 A | 11/1996 | |
| JP | 08-330372 A | 12/1996 | |
| JP | 09-014150 A | 1/1997 | |
| JP | 09-035025 A | 2/1997 | |
| JP | 09-245381 A | 9/1997 | |
| JP | 09-252217 A | 9/1997 | |
| JP | 09-270623 A | 10/1997 | |
| JP | 9-512367 A | 12/1997 | |
| JP | 10-069533 A | 3/1998 | |
| JP | 10-505466 A | 5/1998 | |
| JP | 10-171954 A | 6/1998 | |
| JP | 10-193849 A | 7/1998 | |
| JP | 10-293828 A | 11/1998 | |
| JP | 11-039441 A | 2/1999 | |
| JP | 11-085937 A | 3/1999 | |
| JP | 11-149538 A | 6/1999 | |
| JP | 11-219420 A | 8/1999 | |
| JP | 11-220319 A | 8/1999 | |
| JP | 11-328352 A | 11/1999 | |
| JP | 11-346114 A | 12/1999 | |
| JP | 11-515094 A | 12/1999 | |
| JP | 2000-21128 A | 1/2000 | |
| JP | 2000-021639 A | 1/2000 | |
| JP | 2000-022421 A | 1/2000 | |
| JP | 2005-229474 A | 1/2000 | |
| JP | 2000-059260 A | 2/2000 | |
| JP | 2000-085283 A | 3/2000 | |
| JP | 2000-090207 A | 3/2000 | |
| JP | 2000-132643 A | 5/2000 | |
| JP | 2000-137778 A | 5/2000 | |
| JP | 2000-137785 A | 5/2000 | |
| JP | 2000-148948 A | 5/2000 | |
| JP | 2000-172812 A | 6/2000 | |
| JP | 2000-510271 A | 8/2000 | |
| JP | 2000-276569 A | 10/2000 | |
| JP | 2000-286634 A | 10/2000 | |
| JP | 2000-286760 A | 10/2000 | |
| JP | 2000-311226 A | 11/2000 | |
| JP | 2000-321984 A | 11/2000 | |
| JP | 3075400 U | 11/2000 | |
| JP | 2001-028036 A | 1/2001 | |
| JP | 2007-18067 A | 1/2001 | |
| JP | 2001-043340 A | 2/2001 | |
| JP | 2001-66990 A | 3/2001 | |
| JP | 2001-505682 A | 4/2001 | |
| JP | 2001-168628 A | 6/2001 | |
| JP | 2001-240046 A | 9/2001 | |
| JP | 2001-256457 A | 9/2001 | |
| JP | 2001-514777 A | 9/2001 | |
| JP | 2001-319380 A | 11/2001 | |
| JP | 2001-331976 A | 11/2001 | |
| JP | 2001-332923 A | 11/2001 | |
| JP | 2001-344574 A | 12/2001 | |
| JP | 2001-351084 A | 12/2001 | |
| JP | 2001-352176 A | 12/2001 | |
| JP | 2002-024776 A | 1/2002 | |
| JP | 2002-042076 A | 2/2002 | |
| JP | 2002-063557 A | 2/2002 | |
| JP | 2002-505645 A | 2/2002 | |
| JP | 2002-76750 A | 3/2002 | |
| JP | 2002-150245 A | 5/2002 | |
| JP | 2002-175508 A | 6/2002 | |
| JP | 2002-183690 A | 6/2002 | |
| JP | 2002-185358 A | 6/2002 | |
| JP | 2002-204117 A | 7/2002 | |
| JP | 2002-522849 A | 7/2002 | |
| JP | 2002-230128 A | 8/2002 | |
| JP | 2002-252117 A | 9/2002 | |
| JP | 2002-298109 A | 10/2002 | |
| JP | 2002-308437 A | 10/2002 | |

| | | |
|---|---|---|
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |
| JP | 2003-187211 A | 7/2003 |
| JP | 2003-188338 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-288560 A | 10/2003 |
| JP | 2003-309418 A | 10/2003 |
| JP | 2003-331246 A | 11/2003 |
| JP | 2003-332820 A | 11/2003 |
| JP | 2004-082775 A | 3/2004 |
| JP | 2004-88218 A | 3/2004 |
| JP | 2004-096566 A | 3/2004 |
| JP | 2004-253858 A | 9/2004 |
| JP | 2004-527864 A | 9/2004 |
| JP | 2004-287767 A | 10/2004 |
| JP | 2004-297249 A | 10/2004 |
| JP | 2004-297681 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-124061 A | 5/2005 |
| JP | 2005-129019 A | 5/2005 |
| JP | 2005-136528 A | 5/2005 |
| JP | 2005-165839 A | 6/2005 |
| JP | 2005-167327 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-284352 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-270212 A | 10/2006 |
| JP | 2006-302219 A | 11/2006 |
| JP | 2006-309401 A | 11/2006 |
| JP | 2007-043535 A | 2/2007 |
| JP | 2007-65822 A | 3/2007 |
| JP | 2007-122542 A | 5/2007 |
| JP | 2007-150868 A | 6/2007 |
| JP | 4069958 B2 | 4/2008 |
| JP | 11-175678 A | 1/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/125683 A1 | 11/2007 |
| WO | 2007/138857 A1 | 12/2007 |

OTHER PUBLICATIONS

Official communication issued in counterpart International Application No. PCT/JP2008/058168, mailed Aug. 12, 2008.

Dokai et al.: "Wireless IC Device and Component for Wireless IC Device"; U.S. Appl. No. 12/359,690, filed Jan. 26, 2009.

Dokai et al.: "Test System for Radio Frequency IC Devices and Method of Manufacturing Radio Frequency IC Devices Using the Same"; U.S. Appl. No. 12/388,826, filed Feb. 19, 2009.

Kato et al.: "Wireless IC Device"; U.S. Appl. No. 12/390,556, filed Feb. 23, 2009.

Kato et al.: "Inductively Coupled Module and Item With Inductively Coupled Module"; U.S. Appl. No. 12/398,497, filed Mar. 5, 2009.

Kato et al.: "Article Having Electromagnetic Coupling Module Attached Thereto"; U.S. Appl. No. 12/401,767, filed Mar. 11, 2009.

Taniguchi et al.: "Antenna Device and Radio Frequency IC Device"; U.S. Appl. No. 12/326,117, filed Dec. 2, 2008.

Kato et al.: "Container With Electromagnetic Coupling Module"; U.S. Appl. No. 12/426,369, filed Apr. 20, 2009.

Kato: "Wireless IC Device"; U.S. Appl. No. 12/429,346, filed Apr. 24, 2009.

Dokai et al.: "Wireless IC Device and Component for Wireless IC Device"; U.S. Appl. No. 11/624,382, filed Jan. 18, 2007.

Dokai et al.: "Wireless IC Device, and Component for Wireless IC Device"; U.S. Appl. No. 11/930,818, filed Oct. 31, 2007.

Kato et al.: "Wireless IC Device"; U.S. Appl. No. 12/042,399, filed Mar. 5, 2008.

Kato et al.: "Antenna"; U.S. Appl. No. 11/928,502, filed Oct. 30, 2007.

Kato et al.: "Wireless IC Device"; U.S. Appl. No. 12/211,117, filed Sep. 16, 2008.

Kato et al.: "Antenna"; U.S. Appl. No. 11/688,290, filed Mar. 20, 2007.

Kato et al.: "Electromagnetic-Coupling-Module-Attached Article"; U.S. Appl. No. 11/740,509, filed Apr. 26, 2007.

Kato et al.: "Product Including Power Supply Circuit Board"; U.S. Appl. No. 12/234,949, filed Sep. 22, 2008.

Kato et al.: "Data Coupler"; U.S. Appl. No. 12/252,475, filed Oct. 16, 2008.

Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, mailed on Nov. 27, 2007.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Official Communication issued in International Patent Application No. PCT/JP2008/050945, mailed on May 1, 2008.
Official Communication issued in International Patent Application No. PCT/JP2008/061442, mailed on Jul. 22, 2008.
Official Communication issued in corresponding German Patent Application No. 11 2008 000 065.4, mailed on Apr. 19, 2010.
Official Communication issued in counterpart International Application No. PCT/JP2008/071502, mailed Feb. 24, 2009.
English translation of NL9100176, published on Mar. 2, 1992.
English translation of NL9100347, published on Mar. 2, 1992.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Official communication issued in related U.S. Appl. No. 12/042,399; mailed on Aug. 25, 2008.

* cited by examiner

WIRELESS IC DEVICE

BACKGROUND OF THE INVENTION

1. Field of the Invention

The present invention relates to wireless IC devices, and more specifically, to a wireless IC device, such as a contactless IC medium module used in, for example, an RFID (Radio Frequency Identification) system.

2. Description of the Related Art

Various wireless IC devices including a wireless IC chip and a radiation plate have been proposed.

For example, a contactless IC medium module (RFID) disclosed in Japanese Unexamined Patent Application Publication No. 2003-331246 includes, as illustrated in FIG. 7A which is a top view and FIG. 7B which is a sectional view taken along the line A-A' in FIG. 7A, an insulating substrate 106 on which a loop antenna 102 and one electrode 101 are provided. Another electrode 103 includes a capacitor defined by electrically conductive wires 115 including insulating films. A resonant circuit including the capacitor and the loop antenna 102 is connected to an LSI 104(Large Scale Integration).

The RFID is used in a state in which the LSI, the resonant circuit, and the loop antenna are electrically connected to one another. Therefore, when a large voltage, such as a static electrical charge, is instantaneously applied to, for example, the loop antenna, the voltage is also applied to the LSI through the resonant circuit. When application of this high voltage breaks the LSI, the LSI stops functioning as an RFID module.

In order to electrically connect the individual components, all of the components must be accurately mounted on mounting electrodes. Therefore, a highly accurate mounting device is necessary, which results in an increase in the cost of the RFID.

Furthermore, when the accuracy of the mounting of the components is degraded, the module characteristics of the RFID module are also degraded.

SUMMARY OF THE INVENTION

To overcome the problems described above, preferred embodiments of the present invention provides a wireless IC device that prevents damage, operation failures, and breakdown due to static electrical charge and that is capable of operating even when the accuracy of mounting the components is reduced.

A preferred embodiment of the present invention provides a wireless IC device that includes a radiation plate, a feeding circuit substrate on which a feeding circuit including a resonant circuit including an inductance element is located, the feeding circuit being electromagnetically coupled to the radiation plate, and a wireless IC chip including a connection electrode, the wireless IC chip being disposed on the feeding circuit substrate. A mounting electrode is provided on the feeding circuit substrate. The wireless IC chip is electromagnetically coupled to the mounting electrode. The frequency of signals sent and received using the radiation plate substantially corresponds to a resonant frequency of the resonant circuit.

In the wireless IC device, signals can be sent and received and power can be supplied between the wireless IC chip and the feeding circuit substrate by electromagnetically coupling the wireless IC chip to the mounting electrode using capacitive coupling.

Damage, operation failures, and breakdown of the wireless IC chip caused by static electrical charge can be prevented since the wireless IC chip is not electrically connected to the feeding circuit substrate or the radiation plate.

Since the mounting electrode provided on the feeding circuit substrate is electromagnetically coupled to the wireless IC chip, the allowable range of mounting displacement can be significantly greater than when the wireless IC chip is electrically connected to the feeding circuit substrate.

Furthermore, since the resonant circuit provided on the feeding circuit substrate is electromagnetically coupled to the radiation plate, the allowable range of displacement in mounting the feeding circuit substrate on the radiation plate can be significantly greater than when the feeding circuit substrate is electrically connected to the radiation plate.

The frequency of signals sent and received using the radiation plate is determined by the resonant circuit in the feeding circuit substrate and substantially corresponds to the resonant frequency of the resonant circuit of the feeding circuit substrate. Therefore, since the shape and size of the radiation plate and the coupling state between the feeding circuit substrate and the radiation plate do not substantially affect the resonant frequency of signals, the wireless IC device can be used with a radiation plate having various shapes or sizes without requiring changes in the design of the resonant circuit. Even when the state of coupling between the feeding circuit substrate and the radiation plate changes, the wireless IC device can properly function as a wireless IC device.

Preferably, the resonant circuit further includes a matching circuit.

In this case, characteristic impedances of the wireless IC device and the radiation plate can be easily matched.

Preferably, the wireless IC device further includes a dielectric body disposed between the feeding circuit substrate and the wireless IC chip.

In this case, by disposing a dielectric body between the mounting electrode of the feeding circuit substrate and a terminal electrode of the wireless IC chip, a capacitor is provided between the two electrodes. Using this capacitor, impedance matching can be achieved between the wireless IC chip and the radiation plate. Since it is unnecessary to provide a separate capacitor to achieve impedance matching in the feeding circuit substrate, the size of the feeding circuit substrate can be reduced, and the height of the feeding circuit substrate can be decreased by reducing the number of layers to be stacked.

When the wireless IC chip is to be mounted on the feeding circuit substrate, an underfill resin used to fill the gap between the wireless IC chip and the feeding circuit substrate is preferably provided.

More preferably, the dielectric body is disposed between the mounting electrode of the feeding circuit substrate and the connection electrode of the wireless IC chip.

Preferably, the dielectric body is arranged along a periphery of the wireless IC chip, and the wireless IC chip is covered with the dielectric body.

In this case, since the wireless IC chip is covered with the dielectric body, entry of dirt, debris, water, moisture or other liquid, for example, into the wireless IC chip is prevented.

Preferably, the feeding circuit substrate is arranged so that a surface on which the wireless IC chip is disposed faces the radiation plate, and the resonant circuit and the radiation plate are electromagnetically coupled to each other.

In this case, since the wireless IC chip is arranged between the radiation plate and the feeding circuit substrate, external shocks are applied to the wireless IC chip via the radiation plate or the feeding circuit substrate. Since external shocks are not directly applied to the wireless IC chip, damage or operation failures of the wireless IC chip can be effectively prevented.

Preferably, a relative dielectric constant of the dielectric body is at least about 300, for example.

In this case, the electrostatic capacitance between the wireless IC chip and the feeding circuit substrate can be set to at least a predetermined value, at which sending and receiving between the wireless IC chip and the feeding circuit substrate is possible, provided that the distance between the electrodes of the wireless IC chip and the feeding circuit substrate and the areas of the electrodes are within practical ranges. This facilitates the manufacturing of the wireless IC device.

Preferably, an operating frequency of the wireless IC chip is at least about 300 MHz, or example.

Since static electrical charge has a frequency of about 200 MHz or lower, if the operating frequency of the wireless IC chip is at least about 300 MHz, no high-frequency current caused by static electrical charge flows through the wireless IC device. Thus, the wireless IC device will not be damaged by static electrical charge.

According to various preferred embodiments of the present invention, since the feeding circuit substrate and the wireless IC chip are electromagnetically coupled to each other, damage, operation failures, and breakdown caused by static electrical charge are prevented, and, even when the accuracy of mounting components is reduced, the wireless IC device can still operate properly.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to FIGS. 1 to 6.

First Preferred Embodiment

Figure 1A:
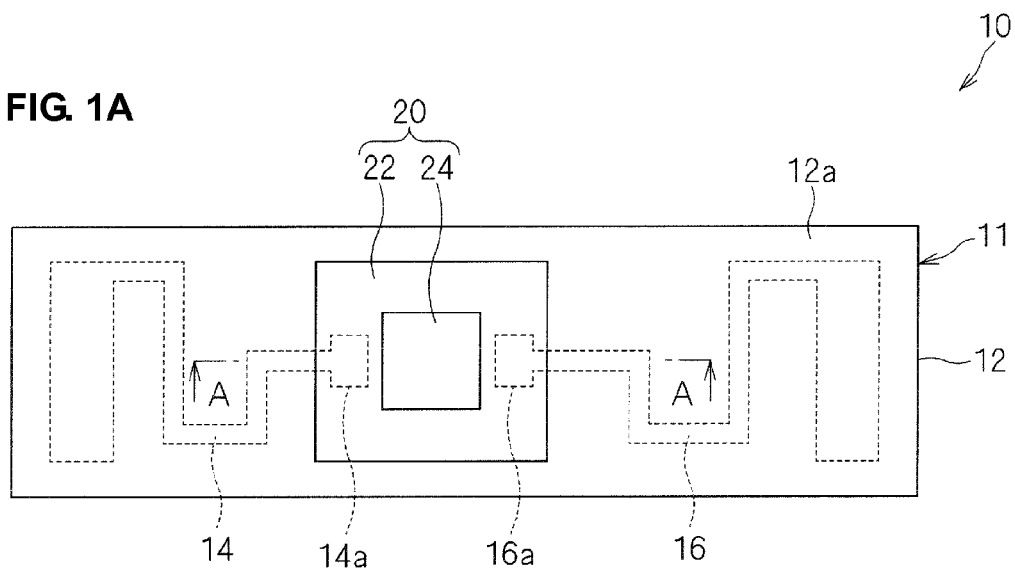
FIG. 1A is a plan view of a wireless IC device according to a first preferred embodiment of the present invention.
Figure 1B:
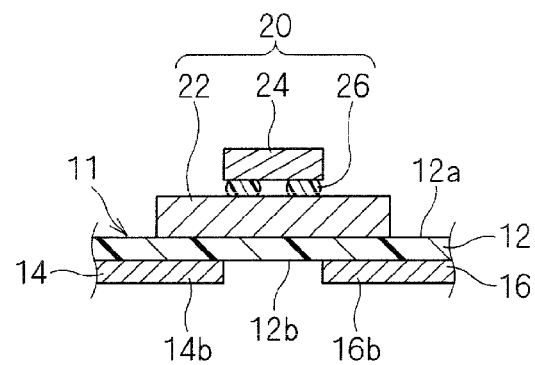
FIG. 1B is a sectional view of a main portion of the wireless IC device.

A wireless IC device according to a first preferred embodiment of the present invention will be described with reference to FIGS. 1A to 3. FIG. 1A is a plan view of a wireless IC device 10. FIG. 1B is a sectional view of a main portion, which is taken along the line A-A in FIG. 1A.

As illustrated in FIGS. 1A and 1B, the wireless IC device 10 includes an electromagnetic coupling module 20 including a feeding circuit substrate 22 and a wireless IC chip 24. The electromagnetic coupling module 20 is mounted on a top surface 12a, which is one of two main surfaces of a base 12 of a radiation plate 11. The wireless IC device 10 includes radiating electrode patterns 14 and 16 disposed on a bottom surface 12b of the base 12. Alternatively, the radiating electrode patterns may be disposed on the same surface on which the electromagnetic coupling module 20 is mounted.

The wireless IC device 10 is used by bonding the bottom surface 12b of the base 12 of the radiation plate 11 to an article (not illustrated in the drawings). When a sheet-shaped resin is used for the base 12, the base 12 can be continuously and efficiently manufactured. The size of the base 12 can be easily reduced, and the wireless IC device 10 can be easily bonded to the surface of a curved article.

In the electromagnetic coupling module 20, as illustrated in FIG. 1B, the feeding circuit substrate 22 and the wireless IC chip 24 are preferably electromagnetically coupled to each other via dielectric bodies 26 made of an adhesive, for example.

Figure 2:
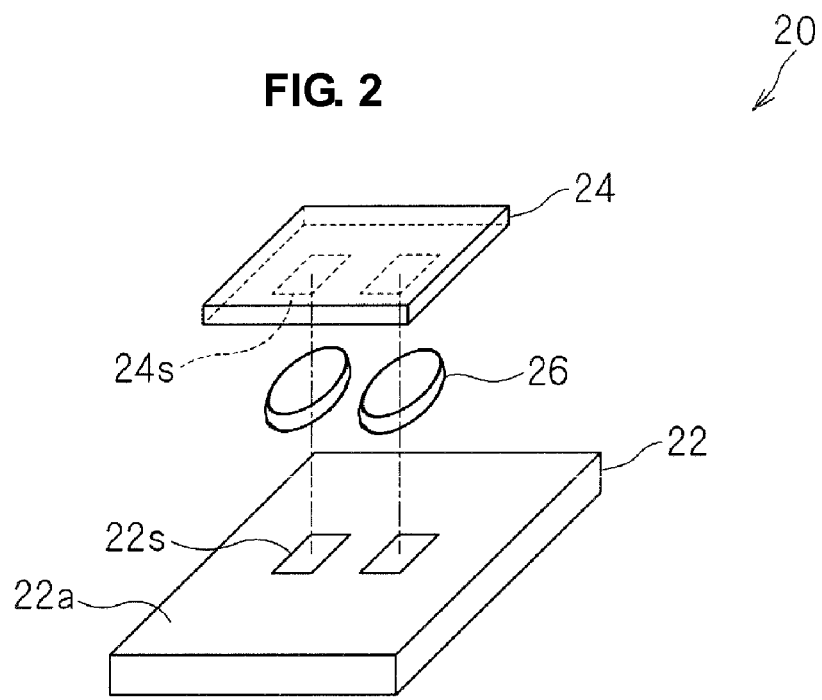
FIG. 2 is an exploded perspective view of an electromagnetic coupling module according to the first preferred embodiment of the present invention

More specifically, as illustrated in the exploded perspective view in FIG. 2, the feeding circuit substrate 22 and the wireless IC chip 24 included in the electromagnetic coupling module 20 are bonded in an aligned arrangement so that mounting electrodes 22s provided on the feeding circuit substrate 22 face terminal electrodes 24s provided on the wireless IC chip 24. At this time, the mounting electrodes 22s of the feeding circuit substrate 22 and the terminal electrodes 24s of the wireless IC chip 24 preferably sandwich the dielectric bodies 26 made of an adhesive, for example.

Figure 3:
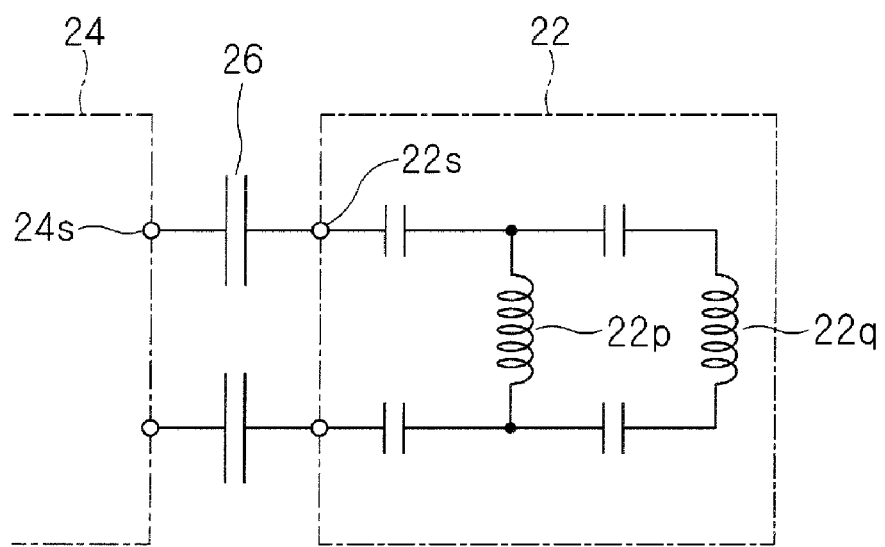
FIG. 3 is an equivalent circuit diagram of the electromagnetic coupling module according to the first preferred embodiment of the present invention.

Accordingly, as illustrated in the equivalent circuit diagram in FIG. 3, the mounting electrodes 22s of the feeding circuit substrate 22 are connected to the terminal electrodes 24s of the wireless IC chip 24 via capacitors defined by the dielectric bodies 26.

For example, by using an adhesive material whose relative dielectric constant is at least about 300 to form the dielectric bodies 26, an electrostatic capacitance of at least about 5 pF can preferably be produced between the mounting electrodes 22s of the feeding circuit substrate 22 and the terminal electrodes 24s of the wireless IC chip 24, each electrode preferably having an area of about 50 μm×about 50 μm, for example.

In order to increase the electrostatic capacitance between the mounting electrodes 22s of the feeding circuit substrate 22 and the terminal electrodes 24s of the wireless IC chip 24, it is necessary (a) to reduce the distance between the electrodes 22s and 24s, that is, to reduce the thickness of the dielectric bodies 26; (b) to increase the areas of the electrodes 22s and 24s, that is, to increase the applied areas of the dielectric bodies 26; and (c) to increase the relative dielectric constant of the dielectric bodies 26. When the relative dielectric constant of the dielectric bodies 26 is at least about 300, the electrostatic capacitance between the electrodes 22s and 24s can be set to at least a predetermined value, at which sending and receiving between the wireless IC chip 24 and the feeding circuit substrate 22 is possible, provided that the distance between the electrodes 22s and 24s and the areas of the electrodes 22s and 24s are within practical ranges. This facilitates the manufacturing of the wireless IC device 10.

In the electromagnetic coupling module 20, for example, after the wireless IC chip 24 is mounted in advance on the feeding circuit substrate 22, the feeding circuit substrate 22 is preferably fixed to the radiation plate 11 using, for example, an adhesive or other suitable bonding agent.

The feeding circuit substrate 22 includes a feeding circuit including a resonant circuit having a predetermined resonant frequency. The predetermined resonant frequency refers to an operating frequency at which the electromagnetic coupling module 20 operates as a wireless IC device. The feeding circuit adjusts, together with the dielectric bodies 26, the characteristic impedances of the radiation plate 11 and the wireless IC chip 24 so as to match each other. The radiation plate 11 emits into the air a sending signal supplied from the feeding circuit substrate 22 via the electromagnetic coupling, and supplies a received receiving signal to the feeding circuit via the electromagnetic coupling.

The frequency of signals sent and received using the radiation plate 11 is determined by the resonant circuit in the feeding circuit substrate 22 and substantially corresponds to the resonant frequency of the resonant circuit of the feeding circuit substrate 22. Therefore, since the shape and size of the radiation plate 11 and the coupling state between the feeding circuit substrate 22 and the radiation plate 11 do not substantially affect the resonant frequency of signals, the wireless IC device can be combined with a radiation plate 11 having various shapes or sizes without requiring changes in the design of the resonant circuit. Even when the coupling state between the feeding circuit substrate 22 and the radiation plate 11 changes, the electromagnetic coupling module 20 can still function as a wireless IC device.

Alternatively, the electrostatic capacitance between the mounting electrodes and the terminal electrodes of the wireless IC chip may preferably be used as a portion of the resonant circuit in the feeding circuit. Accordingly, the degree of freedom to design the resonant circuit is greatly increased.

For example, a multiplayer substrate or a flexible substrate is preferably used for the feeding circuit substrate 22. As illustrated in FIG. 3, the resonant circuit including inductance elements 22p and 22q and capacitance elements is provided. The inductance elements 22p and 22q are preferably electromagnetically coupled to terminals 14a and 16a (see FIG. 1) of the radiating electrode patterns 14 and 16 of the radiation plate 11. Since the feeding circuit substrate 22 and the radiation plate 11 need not be connected so as to establish an electrical connection, the electromagnetic coupling module 20 can preferably be fixed to the radiation plate 11 using an insulating adhesive, for example.

The wireless IC chip 24 is not electrically connected to the feeding circuit substrate 22 or the radiation plate 11. Therefore, a breakdown of the wireless IC chip 24 due to static electrical charge is prevented. Since the wireless IC chip 24 is electromagnetically coupled to the feeding circuit substrate 22, the allowable amount of mounting displacement can be significantly increased as compared to when the wireless IC chip 24 is electrically connected to the feeding circuit substrate 22. Furthermore, since the feeding circuit substrate 22 is electromagnetically coupled to the radiation plate 11, the allowable amount of displacement in mounting the feeding circuit substrate 22 on the radiation plate 11 can be significantly increased as compared to when the feeding circuit substrate 22 is electrically connected to the radiation plate 11.

The electromagnetic coupling module may also be configured as in the second to fourth preferred embodiments of the present invention described below.

Second Preferred Embodiment

Figure 4:
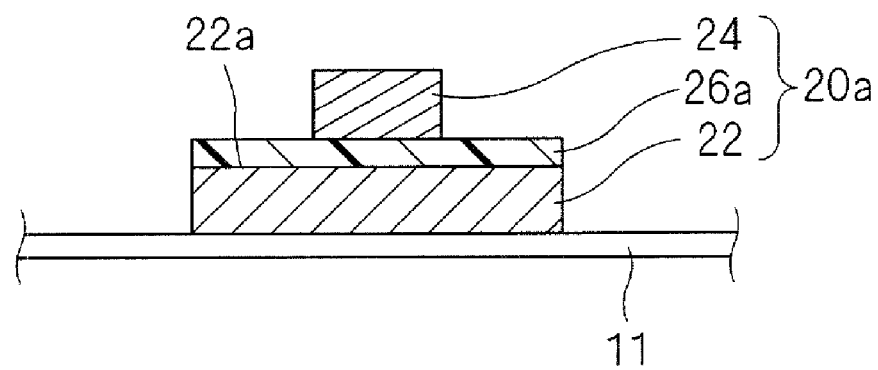
FIG. 4 is a sectional view of a main portion of a wireless IC device according to a second preferred embodiment of the present invention.

In a wireless IC device according to a second preferred embodiment of the present invention, an electromagnetic coupling module 20a is configured as illustrated in a sectional view of a main portion in FIG. 4.

That is, a dielectric body 26a is disposed on substantially the entire surface 22a of the feeding circuit substrate 22, which is on a side on which the wireless IC chip 24 is disposed. Since only a portion of the dielectric body 26a disposed between the mounting electrode 22s of the feeding circuit substrate 22 and the terminal electrode 24s of the wireless IC chip 24 establishes the capacity coupling, the dielectric body 26a may protrude from a portion that is required for capacity coupling.

The area of the dielectric body 26a is increased to substantially the size of the wireless IC chip 24, e.g., about 1000 μm², or greater, and accordingly, the dielectric body 26a can be easily formed.

Since the dielectric body 26a is arranged in substantially the entire space between the wireless IC chip 24 and the feeding circuit substrate 22, the bonding strength between the wireless IC chip 24 and the feeding circuit substrate 22 can be increased as compared to when the dielectric bodies 26 are partially disposed between the wireless IC chip 24 and the feeding circuit substrate 22, as in the first preferred embodiment.

Third Preferred Embodiment

Figure 5:
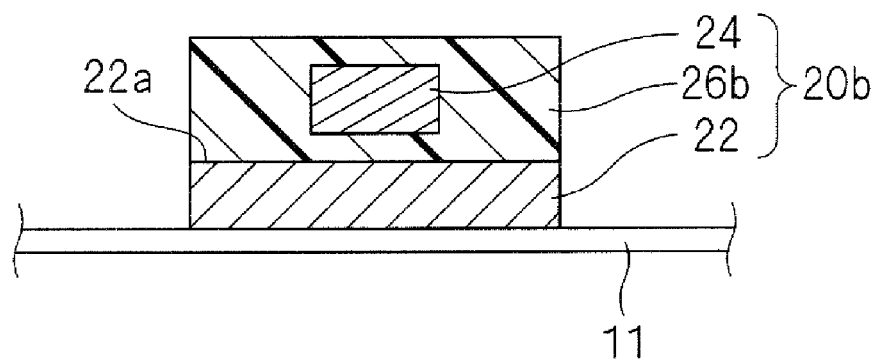
FIG. 5 is a sectional view of a main portion of a wireless IC device according to a third preferred embodiment of the present invention

In a wireless IC device according to a third preferred embodiment of the present invention, an electromagnetic coupling module 20b is configured as illustrated in a sectional view of a main portion in FIG. 5.

A dielectric body 26b preferably made of a mold resin, for example, is arranged along a periphery of the wireless IC chip 24. In a state in which the wireless IC chip 24 is covered with the dielectric body 26, the wireless IC chip 24 is mounted on the feeding circuit substrate 22. Since the wireless IC chip 24 is covered with the dielectric body 26b, entry of dirt, debris, water, moisture or other liquid, for example, into the wireless IC chip 24 is effectively prevented.

Fourth Preferred Embodiment

Figure 6:
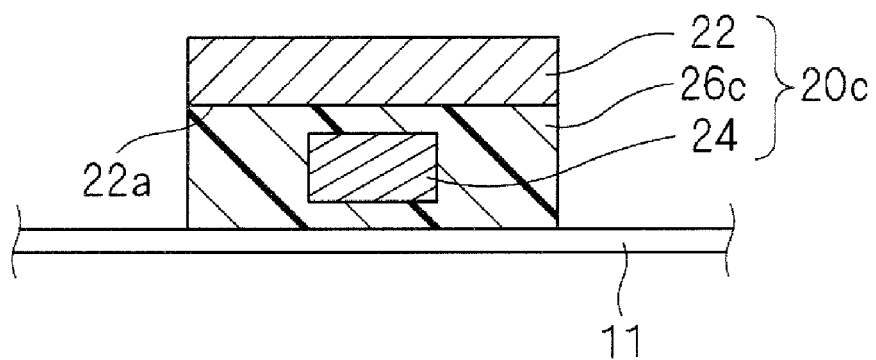
FIG. 6 is a sectional view of a main portion of a wireless IC device according to a fourth preferred embodiment of the present invention.
Figure 7A:
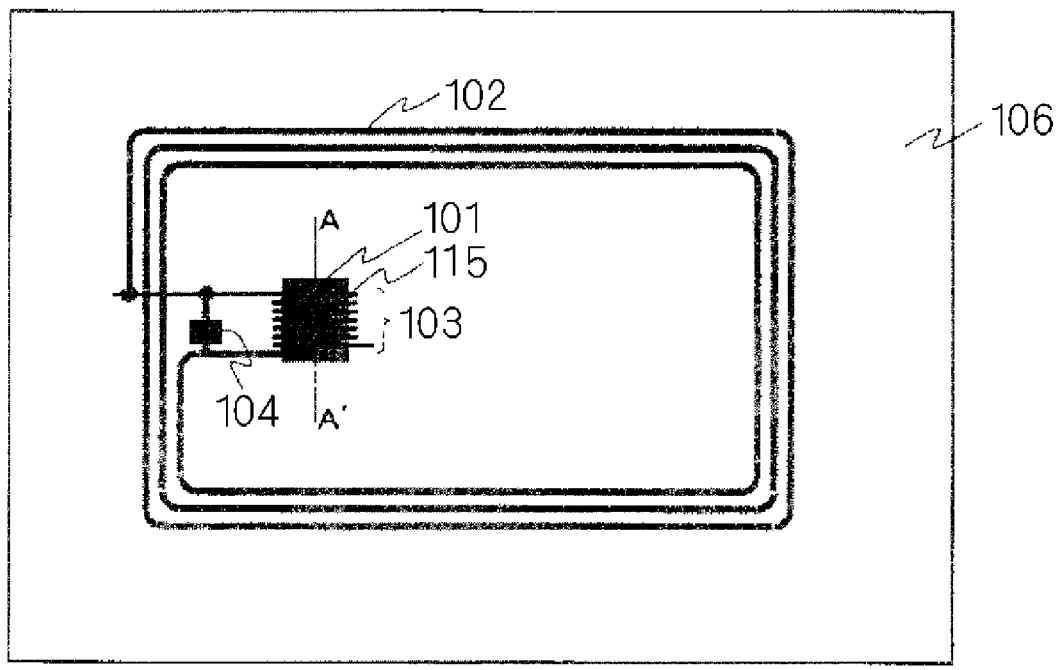
FIG. 7A is a plan view and FIG. 7B is a sectional view of a known wireless IC device.
Figure 7B:
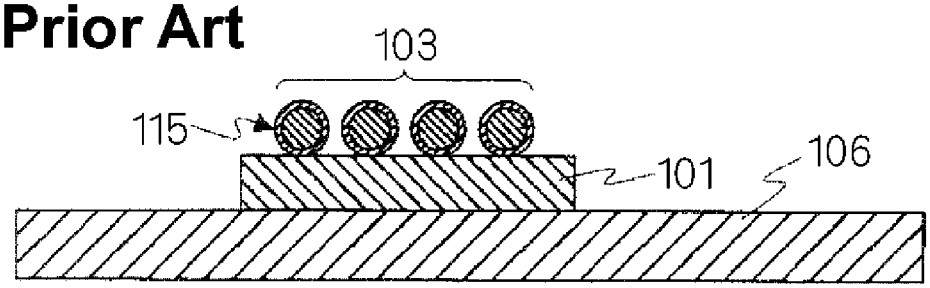

In a wireless IC device according to a fourth preferred embodiment of the present invention, an electromagnetic coupling module 20c is configured as illustrated in a sectional view of a main portion in FIG. 6.

As in the electromagnetic coupling module 20b of the third preferred embodiment illustrated in FIG. 5, in the electromagnetic coupling module 20c, a dielectric body 26c preferably made of a mold resin, for example, is arranged along the periphery of the wireless IC chip 24, and the wireless IC chip 24 is covered with the dielectric body 26c.

The electromagnetic coupling module 20c differs from that in the third preferred embodiment in the mounting orientation relative to the radiation plate 11. That is, the feeding circuit substrate 22 is arranged so that the surface 22a on which the wireless IC chip 24 is mounted faces the radiation plate 11.

Although the radiation plate 11 and the feeding circuit substrate 22 are spaced apart from each other, the radiation plate 11 is preferably electromagnetically coupled to the feeding circuit substrate 22, i.e., coupled only through electric fields, only through magnetic fields, or through both electric fields and magnetic fields. For example, the feeding circuit substrate 22 is preferably defined by a multilayer substrate or a flexible substrate, and inductance elements are provided in or on the feeding circuit substrate 22. Magnetic fields generated by the inductance elements and the radiation plate 11 are arranged to be coupled to each other.

Since a portion of the feeding circuit substrate 22 protruding from the wireless IC chip 24 directly faces the radiation plate 11, if wiring electrodes of the inductance elements are disposed on the protruding portion, electromagnetic coupling with the radiation plate 11 can be easily established.

Since the wireless IC chip 24 is a dielectric body preferably disposed on a silicon substrate, for example, and electromagnetic waves can pass through the wireless IC chip 24, the inductance elements may alternatively be arranged on a portion of the feeding circuit substrate 22 that overlaps the wireless IC chip 24.

Since the wireless IC chip 24 is disposed between the radiation plate 11 and the feeding circuit substrate 22, external shocks are applied to the wireless IC chip 24 via the radiation plate 11, the feeding circuit substrate 22, and a resin 26c. Since external shocks are not directly applied to the wireless IC chip 24, damage or operation failures of the wireless IC chip 24 can be effectively prevented.

In the above-described wireless IC device, the radiation plate and the feeding circuit substrate are preferably electromagnetically coupled to each other, and the feeding circuit substrate and the wireless IC chip are preferably electromagnetically coupled to each other. However, these components are not electrically connected to one another. This prevents a high voltage caused by a static electrical charge from being applied to the wireless IC chip, thereby preventing damage, operation failures, and breakdown due to the static electrical charge.

Since the feeding circuit substrate and the wireless IC chip are electromagnetically coupled to each other, the allowable amount of displacement in mounting the wireless IC chip on the feeding circuit substrate can be significantly increased as compared to when the feeding circuit substrate is electrically connected to the wireless IC chip. Since the feeding circuit substrate and the radiation plate are electromagnetically coupled to each other, the allowable amount of mounting displacement can be significantly increased as compared to when the feeding circuit substrate is electrically connected to the radiation plate. Even when the accuracy of mounting the components is reduced, the wireless IC device can still operate properly.

The present invention is not limited to the foregoing preferred embodiments, and various modifications can be made to the foregoing preferred embodiments.

For example, the feeding circuit of the feeding circuit substrate may preferably include, in addition to the resonant circuit, a matching circuit. In this case, the characteristic impedances of the wireless IC chip and the radiation plate can be easily adjusted to match each other.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
   a radiation plate;
   a feeding circuit substrate on which a feeding circuit including a resonant circuit including an inductance element is provided, the feeding circuit being electromagnetically coupled to the radiation plate;
   a wireless IC chip including a connection electrode, the wireless IC chip being disposed on the feeding circuit substrate; and
   a dielectric body arranged along a periphery of the wireless IC chip and covering the wireless IC chip; wherein
   a mounting electrode is provided on the feeding circuit substrate; and
   the wireless IC chip is electromagnetically coupled to the mounting electrode, and a frequency of signals sent and/or received using the radiation plate substantially corresponds to a resonant frequency of the resonant circuit.

2. The wireless IC device according to claim 1, wherein the resonant circuit further includes a matching circuit.

3. The wireless IC device according to claim 1, wherein the dielectric body is disposed between the feeding circuit substrate and the wireless IC chip.

4. The wireless IC device according to claim 3, wherein the dielectric body is disposed between the mounting electrode of the feeding circuit substrate and the connection electrode of the wireless IC chip.

5. The wireless IC device according to claim 1, wherein the feeding circuit substrate is arranged so that a surface on which the wireless IC chip is disposed faces the radiation plate, and the resonant circuit and the radiation plate are electromagnetically coupled to each other.

6. The wireless IC device according to claim 1, wherein a relative dielectric constant of the dielectric body is at least 300.

7. The wireless IC device according to claim 1, wherein an operating frequency of the wireless IC chip is at least 300 MHz.

8. A wireless IC device comprising:
   a radiation plate;
   a feeding circuit substrate on which a feeding circuit including a resonant circuit including an inductance element is provided, the feeding circuit being electromagnetically coupled to the radiation plate;
   a wireless IC chip including a connection electrode, the wireless IC chip being disposed on the feeding circuit substrate; and
   a dielectric body disposed between the feeding circuit substrate and the wireless IC chip; wherein
   a mounting electrode is provided on the feeding circuit substrate;
   the wireless IC chip is electromagnetically coupled to the mounting electrode, and a frequency of signals sent and/or received using the radiation plate substantially corresponds to a resonant frequency of the resonant circuit; and
   a relative dielectric constant of the dielectric body is at least 300.

9. The wireless IC device according to claim 8, wherein the resonant circuit further includes a matching circuit.

10. The wireless IC device according to claim 8, wherein the dielectric body is disposed between the mounting electrode of the feeding circuit substrate and the connection electrode of the wireless IC chip.

11. The wireless IC device according to claim 8, wherein the dielectric body is arranged along a periphery of the wireless IC chip, and the wireless IC chip is covered with the dielectric body.

12. The wireless IC device according to claim 8, wherein the feeding circuit substrate is arranged so that a surface on which the wireless IC chip is disposed faces the radiation plate, and the resonant circuit and the radiation plate are electromagnetically coupled to each other.

13. The wireless IC device according to claim 8, wherein an operating frequency of the wireless IC chip is at least 300 MHz.

* * * * *